United States Patent
Solomko et al.

(10) Patent No.: US 12,527,235 B2
(45) Date of Patent: Jan. 13, 2026

(54) PHASE CHANGE MATERIAL SWITCH DEVICE AND RELATED METHODS

(71) Applicant: Infineon Technologies AG, Neubiberg (DE)

(72) Inventors: Valentyn Solomko, Munich (DE); Dominik Heiss, Munich (DE); Hans Taddiken, Munich (DE)

(73) Assignee: Infineon Technologies AG, Neubiberg (DE)

( * ) Notice: Subject to any disclaimer, the term of this patent is extended or adjusted under 35 U.S.C. 154(b) by 384 days.

(21) Appl. No.: 18/352,612

(22) Filed: Jul. 14, 2023

(65) Prior Publication Data

US 2024/0032445 A1    Jan. 25, 2024

(30) Foreign Application Priority Data

Jul. 25, 2022   (EP) .................................... 22186708

(51) Int. Cl.
*H10N 70/20* (2023.01)
*H10N 70/00* (2023.01)

(52) U.S. Cl.
CPC ......... *H10N 70/231* (2023.02); *H10N 70/828* (2023.02); *H10N 70/8613* (2023.02)

(58) Field of Classification Search
CPC ............... H10N 70/231; H10N 70/828; H10N 70/8613; H10N 70/823; H10N 70/8828; H03K 17/102; H03K 17/002
See application file for complete search history.

(56) References Cited

U.S. PATENT DOCUMENTS

| | | | |
|---|---|---|---|
| 11,057,019 B2* | 7/2021 | El-Hinnawy | ........... H01P 1/181 |
| 2007/0249311 A1 | 10/2007 | Murphy | |
| 2020/0058850 A1 | 2/2020 | El-Hinnawy et al. | |
| 2023/0343531 A1* | 10/2023 | Solomko | ................ H01H 37/14 |

FOREIGN PATENT DOCUMENTS

WO    2022265845 A1    12/2022

* cited by examiner

*Primary Examiner* — Allison Bernstein
(74) *Attorney, Agent, or Firm* — Murphy, Bilak & Homiller, PLLC

(57) ABSTRACT

A phase change material switch device is provided. In one implementation, the phase change material switch device includes a phase change material and a heater device thermally coupled to the phase change material. During heating phases, a coupling device provides a first electrical impedance between a power source and the heater device. Outside the heating phases, the coupling device provides a second, higher, impedance.

16 Claims, 7 Drawing Sheets

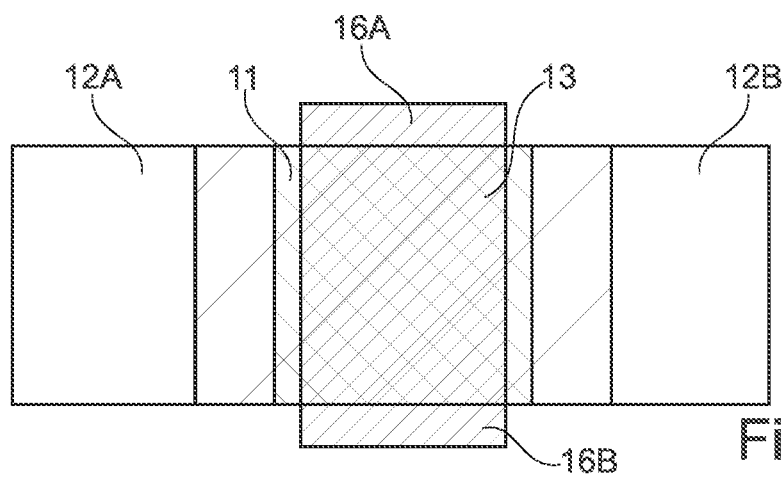
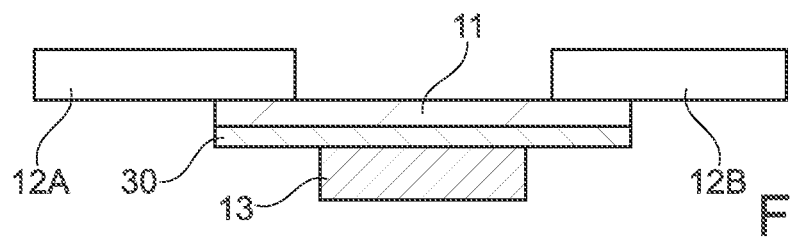
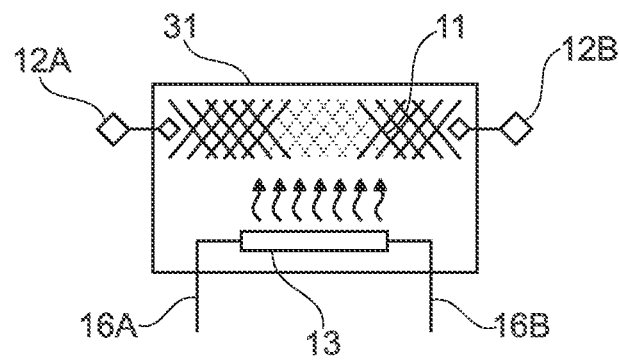
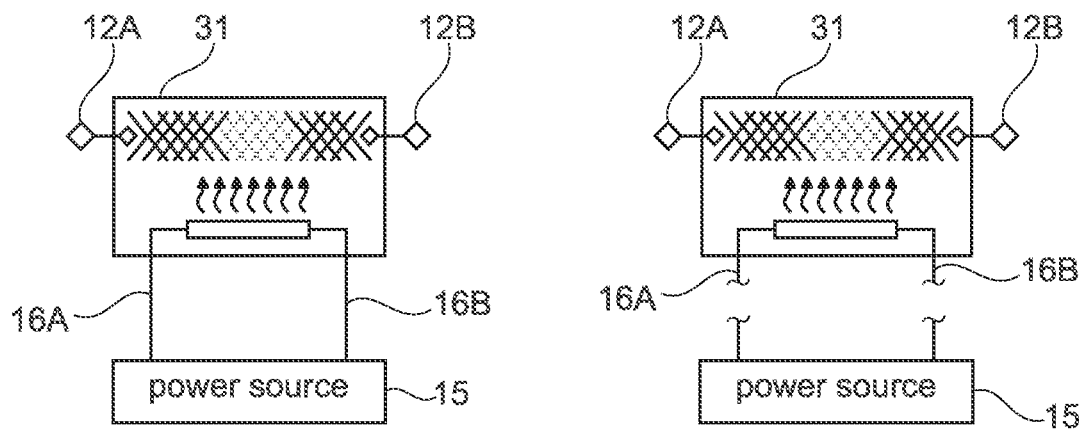
Fig. 3A
Fig. 3B
Fig. 3C
Fig. 4A    Fig. 4B

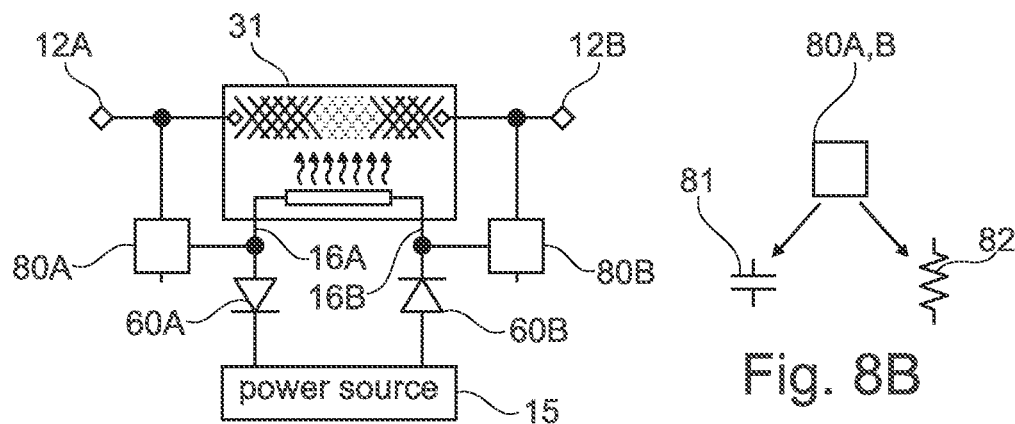
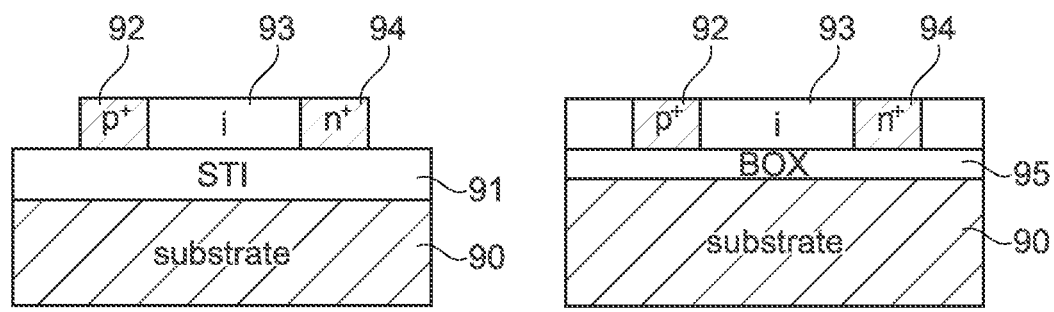
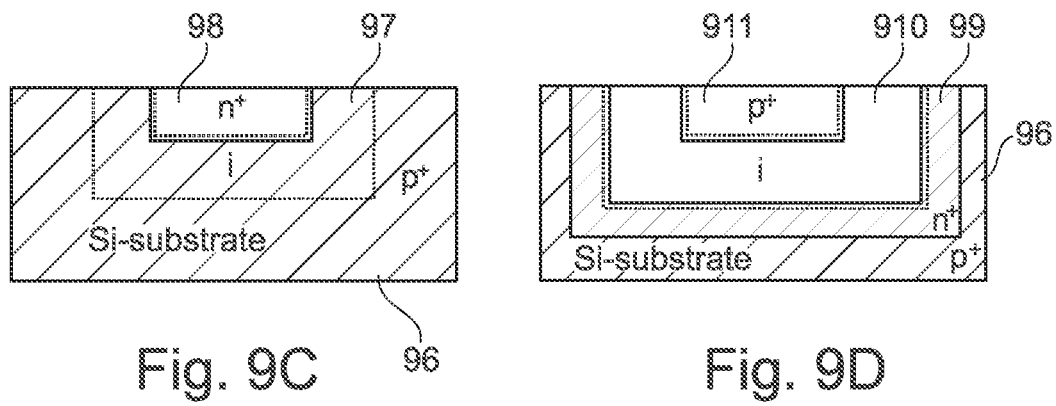

PHASE CHANGE MATERIAL SWITCH DEVICE AND RELATED METHODS

TECHNICAL FIELD

The present application relates to phase change material (PCM) switch devices, sometimes also simply referred to as phase change switch devices, and to corresponding methods.

BACKGROUND

The technical requirements for radio frequency (RF) applications using high frequencies, such as radar sensing and mobile communication according to the 5G standard, are increasing. In particular, switches having improved characteristics compared to state-of-the-art CMOS switches will be required to meet future demands. Phase change switches are considered as promising candidates for switching RF signals. Such phase change switches use a phase change material (PCM) which typically exhibits a higher electric conductivity in a crystalline phase state than in an amorphous phase state. By changing the phase state of the phase change material, a switch device including such a material may be switched on and off.

For example, to change the phase state from amorphous to crystalline, typically a heater is employed heating the phase change material causing crystallization. This switching on by causing crystallization is also referred to as a set operation. In the set operation, the heater is actuated in such a way that the temperature of the phase change material is above its crystallization temperature, typically about 250° C., but below the melt temperature typically in a range of 600° C. to 900° C., for example. The length of the heating pulse caused by the heater is chosen such that any amorphous portion present in the PCM can regrow into the crystalline phase state.

When switching off the switch device, also referred to as reset operation, the heater is actuated in such a way that the temperature of the PCM is raised above the melt temperature (for example above about 600° C. to 900° C.) followed by a comparatively rapid cooldown which freezes the phase change material or at least a portion thereof into an amorphous state.

Suitable phase change materials used for such phase change switches include germanium telluride (Gere) or germanium-antimony-tellurium (GeSbTe, usually referred to as GST), and heaters may be made of a material like polycrystalline silicon or tungsten.

PCM switch devices promise excellent radio frequency performance in comparison to state of the art CMOS RF switches. In particular, the main figure of merit, the product of on-resistance and off capacitance, is reduced significantly from around 80 fsec for CMOS RF switches to values below 20 fsec for PCM switch devices.

In particular, a low off capacitance is desirable in applications like antenna tuning, as resonant modes of tuning networks including such switches may adversely influence the antenna properties at a high operating frequency.

For example, when for tuning purposes such a PCM switch is coupled in series to an inductor having an inductance L, the off state capacitance $C_{OFF}$ of the switch creates a series resonance at a frequency $$f_{res} = \frac{1}{2\pi\sqrt{LC_{OFF}}}.$$

This resonance frequency must be shifted to a value outside the operating frequency range of the respective system, for example radio frequency antenna, by either minimizing the inductance value L or minimizing $C_{off}$. The latter option is preferred, as it offers a higher degree of freedom in choosing the tuning elements, in particular inductances thereof, of a system.

SUMMARY

According to an embodiment, a phase change material switch device is provided, comprising: a phase change material; a heater device thermally coupled to the phase change material; a power source; and a coupling device electrically coupled between the power source and the heater device, wherein the coupling device is configured to: provide a first electrical impedance between the power source and the heater device in a first state where current is supplied to the heater device from the power source for heating the phase change material, and provide a second electrical impedance between the power source and the heater device higher than the first electrical impedance in a second state outside heating phases of the heater device.

According to another embodiment, a method of operating a phase change material switch device including a phase change material and a heater device thermally coupled to the phase change material is provided, the method comprising: providing a first electrical impedance between a power source and the heater device in a first state where current is supplied to the heater device from the power source for heating the phase change material; and providing a second electrical impedance between the power source and the heater device higher than the first electrical impedance in a second state outside heating phases of the heater device.

The above summary is merely a brief overview over some embodiments and is not to be construed as limiting in any way, as other embodiments may include different features.

BRIEF DESCRIPTION OF THE DRAWINGS

FIGS. 3A and 3B illustrate an implementation example of a phase change material switch device, and FIG. 3C shows a symbol used to represent part of such a phase change material switch device.

FIGS. 4A and 4B are diagrams illustrating operation of phase change material switch devices according to embodiments.

FIGS. 5 to 14 illustrate phase change material switch devices according to various embodiments.

DETAILED DESCRIPTION

Figure 1:
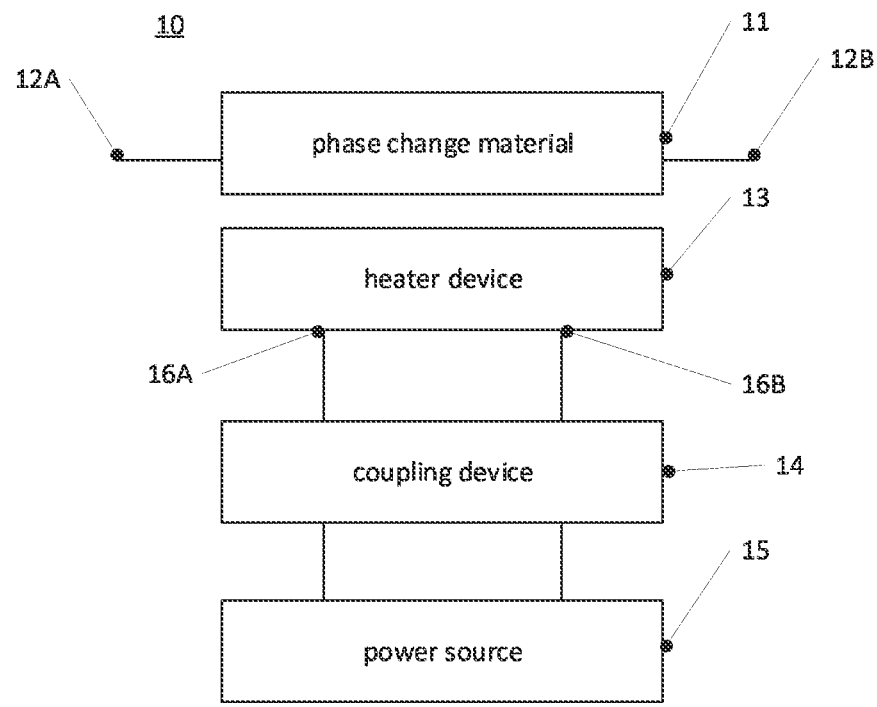
FIG. 1 is a block diagram of a phase change material switch device according to an embodiment.

In the following, various embodiments will be described in detail referring to the attached drawings. The embodiments described hereinafter are to be taken as examples only and are not to be construed as limiting. For example, while in embodiments specific arrangements or components are provided, in other embodiments other configurations may be used.

Implementation details described with respect to one of the embodiments are also applicable to other embodiments.

Features from different embodiments may be combined to form further embodiments. Variations and modifications described for one of the embodiments may also be applied to other embodiments and will therefore not be described repeatedly.

In the Figures, like elements are designated with the same reference numerals. Such elements will not be described repeatedly in each Figure to avoid repetitions. Any directional terminology used when referring to the drawings (e.g. up, down, left, right) is merely for indicating elements and directions in the drawings and is not intended to imply a directional orientation of the actually implemented devices.

Besides features (for example components, elements, acts, events or the like) explicitly shown and described, in other embodiments additional features may be provided, for example features used in conventional switch devices using phase change materials. For example, embodiments described herein relate to equalization devices in phase change material (PCM) switch devices, and other components and features, like spatial arrangement of heaters and phase change material, radio frequency (RF) circuitry using the switch device and the like may be implemented in a conventional manner. Such RF circuitry may be integrated with the described switch devices on the same substrate, but may also be provided separately for example, on one or more separate chip dies, which in some implementations then may be combined with a switch device in a common package. Also, manufacturing implementations like providing phase change material on a substrate like a silicon substrate to implement a PCM switch device or in a part thereof like a trench for manufacturing the switch device and the like may be performed in any conventional manner.

A switch based on a phase change material (PCM) will be referred to as a phase change switch (PCS) or PCM switch herein. As explained in the introductory portion, such phase change switches may be set to a crystalline phase state or an amorphous phase change, thus changing the resistance of the phase change material and therefore of the switch by several orders of magnitude. In this way, for example an on-resistance of a switch in a range of 1 to 100Ω may be achieved, whereas an off-resistance may be several orders of magnitude higher, for example at least in the Kiloohm range.

PCM switch devices discussed herein may be manufactured for example in layer deposition and pattering processes similar to those used in semiconductor device manufacturing, by depositing or modifying layers on a substrate. In some embodiments discussed herein, cross-sectional views and top views are illustrated. A cross-sectional view essentially corresponds to a cross section through the substrate, whereas a top view is a view in a direction towards a surface of the substrate.

While phase change switch devices in the embodiment below are shown with a configuration where a heater is provided below a phase change material, in other embodiments the heater may be provided above the phase change material. Furthermore, currents through the phase change material and through the heater may run in the same direction or in different, for example perpendicular directions. Therefore, the specific configurations shown are not to be construed as limiting in any way.

Turning now to the figures, FIG. 1 illustrates a phase change material switch device (PCM switch device) 10 according to an embodiment. PCM switch device 10 includes a phase change material 11, electrically contacted via terminals 12A, 12B, for example electrodes 12A, 12B. A heater device 13 is placed adjacent to phase change material 11, electrically isolated but thermally coupled to phase change material 11. By heating phase change material 11 using heater device 13, as in conventional PCM switch devices, phase change material 11 may be selectively set to a crystalline, electrically conducting state or to an amorphous, electrically isolating state. It should be noted that in the amorphous state phase change material 11 need not become fully amorphous, but some crystalline portions may remain for example in the vicinity of terminals 12A, 12B, as long as the phase change material in the amorphous state provides an electrical isolation between terminals 12A and 12B. Phase change material 11 may be any suitable phase change material described above. Therefore, in the crystalline state phase change material 11 provides an electrical connection between terminals 12A and 12B, and in the amorphous state, phase change material 11 provides an electrical isolation between terminals 12A and 12B, corresponding to a switch function. In some embodiments, terminals 12A, 12B may be radio frequency (RF) terminals, such that the PCM switch device 10 serves to switch RF signals.

Heater device 13 is supplied with electrical power by a power source 15. When power source 15 supplies power to heater device 13, heater device 13 heats up and therefore heats phase change material 11. Power source 15 may be a pulse power source and may include further components for regulation of the supplied current or voltage. Heater device 13 may include one or more individual heaters.

Power source 15 is coupled to terminals 16A, 16B of heater device 13 by a coupling device 14.

Coupling device 14 is configured to selectively provide a first electrical impedance or a second electrical impedance between power source 15 and terminals 16A, 16B of heater device 13. The second electrical impedance is higher than the first electrical impedance, for example at least 100 times higher. A magnitude of the second electrical impedance for example may be 1 kΩ or higher, whereas a magnitude of the first electrical impedance may be 50Ω or less. In some embodiments, the second electrical impedance may effectively decouple power source 15 from heater device 13. The terms "first electrical impedance" and "second electrical impedance" are to be understood as not necessarily being fixed values, but may also be values in different ranges, as long as the second electrical impedance is higher than the first electrical impedance.

Coupling device 14 is configured to provide the first electrical impedance when electrical power is to be supplied from power source 15 to heater device 13, i.e. during heating phases of heater device 13. Coupling device 14 is further configured to provide the second electrical impedance outside heating phases, i.e. when no electrical power is to be supplied from power source 15 to heater device 13. The first electrical impedance and/or the second electrical impedance may include ohmic and/or reactive components.

As will be explained below in more detail, in some embodiments, coupling device 14 may be implemented using pi-n diodes. In other embodiments, coupling device 14 may be implemented using transistor switches.

Providing the second, higher impedance between power source 15 and heater device 13 outside heating phases, in particular when the PCM switch device 10 is used for selective signal transmission, for example of RF signals, in some implementations, may improve the RF voltage handling capabilities of the PCM switch device, may improve the off-state capacitance and resistance of the PCM switch device, may improve the linearity of the PCM switch device and/or may improve insertion losses when the PCM switch device is switched on. In other embodiments, other effects may result.

Figure 2:
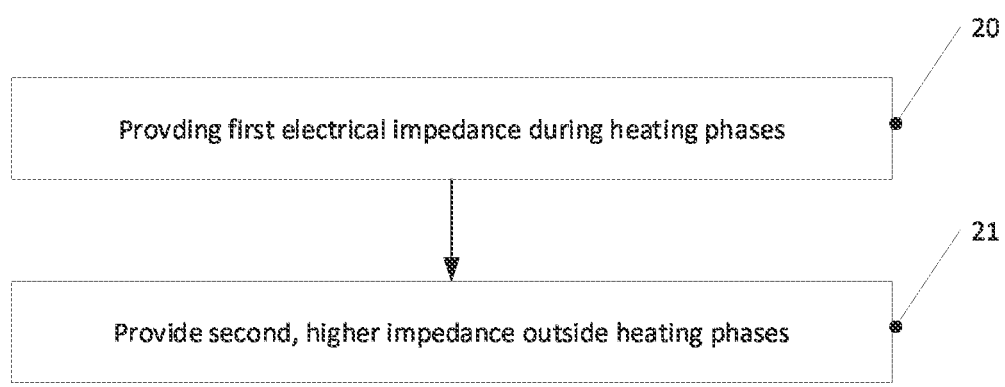
FIG. 2 is a flowchart illustrating a method according to an embodiment.

FIG. 2 is a flowchart illustrating a method according to an embodiment. The method of FIG. 2 may be implemented using the PCM switch device 10 of FIG. 1 or any of the PCM switch devices discussed further below, but is not limited thereto. In order to avoid repetitions, reference will be made to the above explanations for FIG. 1 when explaining the method of FIG. 2.

At 20, the method comprises providing a first electrical impedance between a power source and a heater device of a PCM switch device during heating phases, i.e. when power is supplied to the heating device for heating a phase change material of the PCM switch device to change the state thereof, as explained above.

At 21, the method comprises providing a second, higher, impedance outside the heating phases as explained above, for example to effectively decouple the power source from the heater device.

It should be noted that the providing of the first and second electrical impedances at 20 and 21 need not be performed in the order shown and/or may be performed repetitively. For example, the providing of the first electrical impedance at 20 may be performed every time when the phase change material is to be heated, and the providing of the second impedance may be generally performed outside heating phases, i.e. every time when no power is supplied to the heater device from the power source.

Next, various example implementations of PCM switch devices and in particular of coupling device 14 as discussed above will be discussed. First, with reference to FIGS. 3A to 3C, an example configuration of a structure including a phase change material and a heater device will be discussed. While this configuration is taken as an example, as already mentioned above, other configurations may also be used. For example, while in the configuration shown a heater is arranged below a phase change material, in other embodiments, a heater may be provided above a phase change material, or around a phase change material.

In the example of FIGS. 3A to 3C, the PCM switch device is provided as a layered structure, for example by depositing and structuring corresponding layers on a substrate like a semiconductor substrate, for example using processes from semiconductor processes.

FIG. 3A shows a top view, and FIG. 3B shows a sectional view of the PCM switch device.

The PCM switch device of FIGS. 3A and 3B includes a heater device 13 including a single heater and a phase change material 11. Heater device 13 and phase change material 11 are separated by a dielectric layer 30, which is electrically insulating, but couples heater 13 thermally to phase change material 11. The dielectric material of layer 30 may for example be an oxide or nitride layer, like silicon dioxide or silicon nitride. Terminals 12A and 12B are provided as electrodes on phase change material 11.

Heater 13 heats phase change material 11 at least in a middle portion thereof. In some embodiments, portions of phase change material 11 contacting terminals 12A, 12B may always remain in a crystalline state with low electrical resistance, whereas the middle portion changes between the amorphous state and the crystalline state based on the heating to switch the switch device on and off. The structure shown in FIGS. 3A and 3B may for example be surrounded by a dielectric material, which may be the same material or a different material from the material of layer 30. On heater 13, heater terminals 16A, 16B are provided, via which heater 13 may be supplied with electrical power for heating.

FIG. 3C shows a symbol 31 which will be used to represent the arrangement of heater 13 and phase change material 11, with terminals 12A, 12B, 16A and 16B, in the following figures. This arrangement will also referred to as PCM switch 31 in the following. In embodiments, a PCM switch device may include PCM switch 31, a power source and a coupling device.

FIGS. 4A and 4B illustrate the effect of coupling device 14 of FIG. 1 and the method of FIG. 2. FIG. 4A illustrates a state where the first impedance is provided, which may correspond to a low-ohmic electric coupling of power source 15 to terminals 16A, 16B of the heater device. FIG. 4B illustrates a state where the second, higher, impedance is provided, which in some embodiments, as shown in FIG. 4B, may essentially correspond to a decoupling of power source 15 from heater terminals 16A, 16B.

Figure 5:
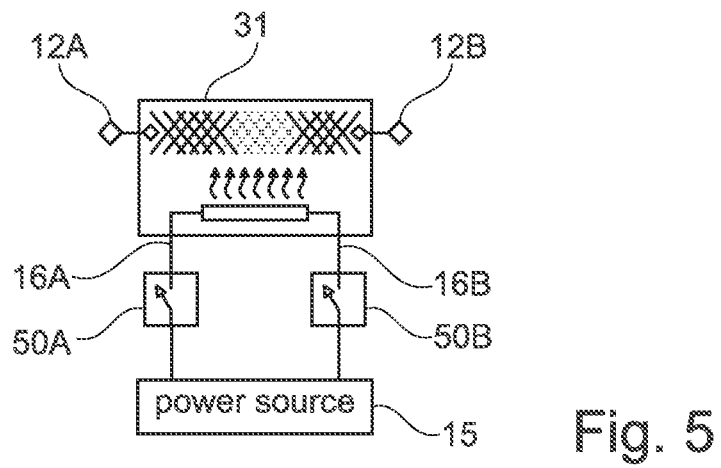

FIG. 5 illustrates a PCM switch device according to a further embodiment. In the embodiment of FIG. 5, the coupling device includes a first switch device 50A and a second switch device 50B. Each of switch devices 50A, 50B is configured to selectively couple power source 15 to heater terminals 16A, 16B, respectively. In other embodiments, other devices than switch devices may be provided to implement a coupling device, as long as the function of providing the first and second impedance is fulfilled. For example, as will be explained below, instead of switch devices diodes may be used, or other coupling networks may be provided.

Switch devices may for example be implemented using transistor switches. For providing the first impedance, the switch devices are closed, and for providing the second impedance, the switch devices are opened.

Figure 6:
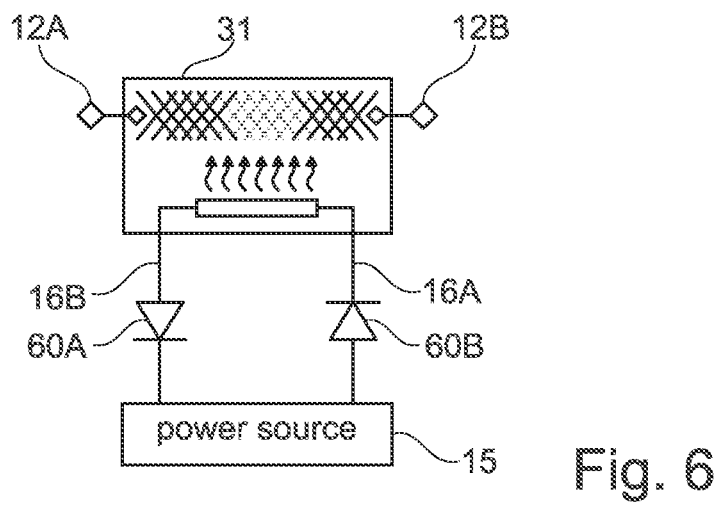

FIG. 6 illustrates a further embodiment. Here, the coupling device is provided by p-i-n diode 60A, 60B coupled as shown between power source 15 and heater terminals 16A, 16B, respectively. The polarity of diodes 60A, 60B is selected such that when power is to be supplied to the heater, the diodes are forward biased, such that in the example of FIG. 6, current flows from power source 15 through diode 60B to heater terminal 16B and back via heater terminal 16A in diode 60A to power source 15. Diodes 60A, 60B in embodiments may be p-i-n diodes, i.e. with an intrinsic region between a p-doped region and an n-doped region of the diode. Particular implementation examples of such p-i-n diodes will be explained further below with respect to FIGS. 9A to 9D. Due to the intrinsic region, when no power is supplied by power source 15, diodes 60A, 60B are in an off-state exhibiting a high impedance (essentially a capacitance, which is lower than without the intrinsic region, corresponding to a higher impedance than without the intrinsic region), thus providing the second impedance. In some implementations, the use of p-i-n diodes may provide high RF voltage handling capabilities in an off-state, for example 30 V or higher, may provide low non-linear distortion in the off-state also at high RF voltage excitations, i.e. when high RF signals are conducted by the PCM switch device, and may provide a low load capacitance at the heater terminals, which may lead to an advantageous figure of merit as the product of the on-resistance Ron and the off-capacitance Coff.

Figure 7:
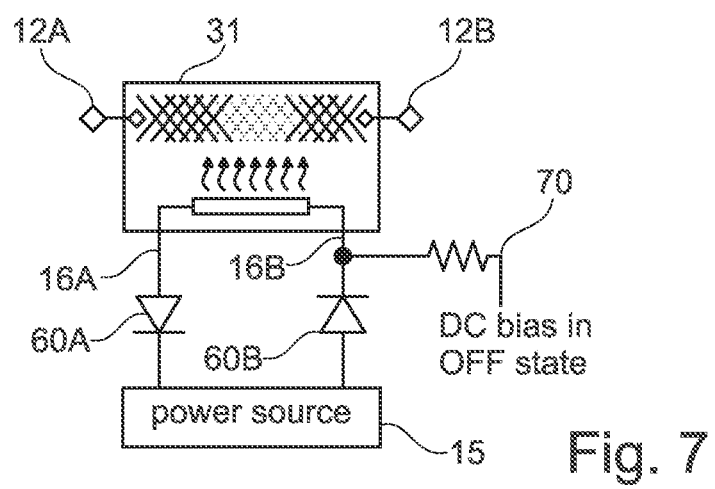

The RF voltage handling capability of the diodes may be further improved in some embodiments and the off-state capacity may be reduced by applying a reverse bias voltage from a DC terminal (labelled "DC bias in OFF state" in FIG. 7) via a high ohmic resistor 70, which may have a resistance in the range of 10 kΩ to 100 kΩ, as shown in FIG. 7. The DC bias voltage supplied in embodiments may be in a range of +/−3V, but may be higher in other embodiments, for example up to +/−40V or even higher.

In some embodiments, additionally impedance networks may be provided between one or both of the terminals 12A, 12B and the heater terminals 16A, 16B. A corresponding embodiment is shown in FIG. 8A, which is based on the embodiment of FIG. 6. In addition to the components already described with respect to FIG. 6, the PCM switch device of FIG. 8A includes a first impedance network 80A coupled between terminal 12A and heater terminal 16A, and a second impedance network 80B coupled between terminal 12B and heater terminal 16B. Via the impedance networks 80A, 80B, potentials (voltage levels) at terminals 16A, 16B, may be brought closer to the potentials at terminals 12A, 12B outside heating phases, i.e. when the switch is used to conduct (on-state) or block (off-state) signals. In some embodiments, additionally or alternatively impedance networks 80A, 80B may linearly distribute a voltage at terminal 12A over the heater device. In this way, a voltage handling of the PCM switch device may be improved in some embodiments by reducing the voltage drop between the heater device and the phase change material in the PCM switch device.

As illustrated in FIG. 8B, impedance networks 80A, may include a capacitive coupling element 81, for example a capacitor, a resistive coupling element 82, for example a resistor, or a combination thereof. Generally, impedance networks 80A, 80B may comprise linear circuit elements or a combination thereof.

In case of capacitive element 81, when the capacitance value equals to the off-state capacitance of the respective coupling device, in case of FIG. 8A, diode 60A, and one terminal of the switch device (for example terminal 12B) is grounded, then the voltage magnitude at the heater terminal will be half of the applied radio frequency voltage at terminal 12A. Such a heater excitation may improve the voltage handling capability of the PCM switch device. Therefore, in embodiments, the capacitor of the capacitive element 81 may be equal to the capacitance of the coupling device, for example diode 60A, 60B, where outside the heating phases, i.e. when the second impedance value is provided.

Similar considerations apply in case of a resistive element 82, when the magnitude of the resistance value equals the magnitude of the impedance based on the off-capacitance of the diode 60A, 60B, or in other words, the impedance magnitudes are equal. Also in this case, the voltage magnitude at heater terminal 16A may be approximately half of the applied radio frequency voltage at terminal 12A, when for example terminal 12B is grounded. Also this may improve voltage handling capabilities of the PCM switch device.

FIGS. 9A to 9D show various implementation possibilities for p-i-n diodes usable as diodes 60A, 60B in FIG. 8A. Other possibilities for implementing the diodes may also be used. FIGS. 9A to 9D show cross-sectional views of diode structures.

In FIG. 9A, the p-i-n diode is implemented as a polysilicon diode including a highly p-doped portion 92, an intrinsic portion 93 and a highly n-doped portion 94. Intrinsic portion, in this respect, may indicate a nominally undoped portion, or a portion with very low defined dopant concentration. The polysilicon diode is implemented on a shallow trench isolation (STI) 91 on a substrate 90. STI 91 electrically isolates the p-i-n diode from the substrate.

FIG. 9B shows an implementation of a p-i-n diode including highly p-doped region 92, intrinsic region 93 and highly n-doped region 94 on a silicon on insulator (SoI) substrate with a buried oxide (BOX) 95 on substrate 90. In this case, the diode may be a polysilicon diode or may be a single crystal silicon diode. BOX 95 electrically isolates the p-i-n diode from the substrate.

FIGS. 9A and 9B show so-called lateral implementations of the diode. FIGS. 9C and 9D show vertical implementations. In FIG. 9C, an intrinsic region 97 is provided in a highly p-doped substrate 96. An n-doped region 98 is formed in the intrinsic region 97, thus forming a p-i-n diode.

In FIG. 9D, the implementation is in a so-called triple well structure. Again, a p-doped substrate 96 is used. As shown in FIG. 9D, in p-type substrate 96, an n+ well 99 is formed, in which an intrinsic region 910 is provided, in which in turn a p-doped region 911 is provided. Regions 99, 911 in this case serve as n- and p-doped regions of the p-i-n diode, respectively. The triple well structure also provides an electrical isolation from the substrate 96. Contacting of the diodes may be performed in any conventional way known in semiconductor manufacturing, for example by depositing metal electrodes on the respective p- and n-doped portion of the diodes.

Figure 10:
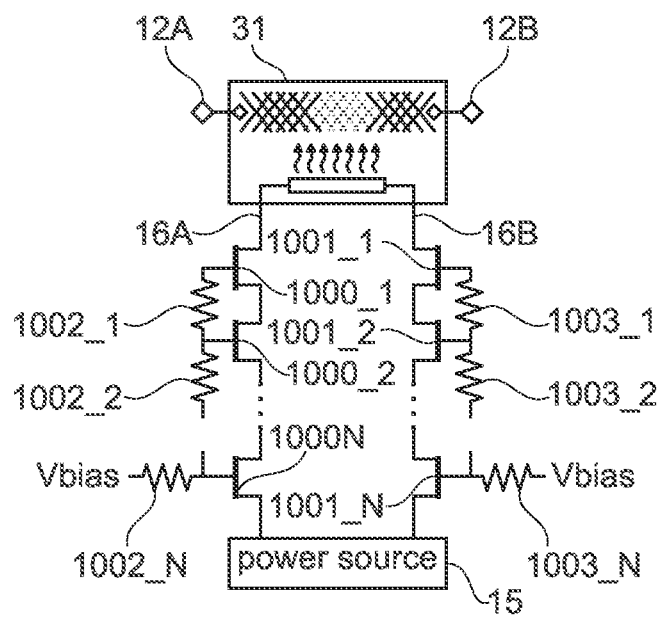

Instead of diodes, as already mentioned above, also switch devices (see switch devices 50A, 50B of FIG. 5) like transistor switches may be used. FIG. 10 shows a corresponding embodiment with an implementation example of switch devices.

In the embodiment of FIG. 10, power source 15 is coupled to terminal 16A via N stacked MOSFETs 1000_1 to 1000_N, and to heater terminal 16B via N stacked MOSFETs 1001_1 to 1001_N. The number of MOSFETs used may depend on the voltages present. Generally, a higher number N leads to a higher voltage stability in an off-state. In some embodiments, a single MOSFET may be sufficient (N=1) whereas in other embodiments more than one MOSFET may be required.

MOSFETs 1000_1 to 1000_N are biased with a bias voltage Vbias via a resistive ladder 1002_1 to 1002_N as shown, and MOSFETs 1001_1 to 1001_N are biased via a resistive ladder 1003_1 to 1003_N with voltage Vbias. The voltage Vbias may be changed to switch the MOSFETs on and off, to provide the first and second impedances, respectively. Although not shown in FIG. 10, similar to FIG. 8A, impedance networks 80A, 80B may be provided, which may be matched to an off-capacitance on MOSFETs 1000_1 to 1000_N, 1001_1 to 1001_N when switched off, as explained with respect to FIGS. 8A and 8B for the off-capacitance of diode 60A, 60B.

In the embodiments described previously, a heater device including a single heater is provided heating phase change material 11. In other embodiments, a plurality of heaters may be provided, heating different portions of a phase change material 11 or phase change materials 11 coupled in series. Corresponding embodiments will be described next.

Figure 11:
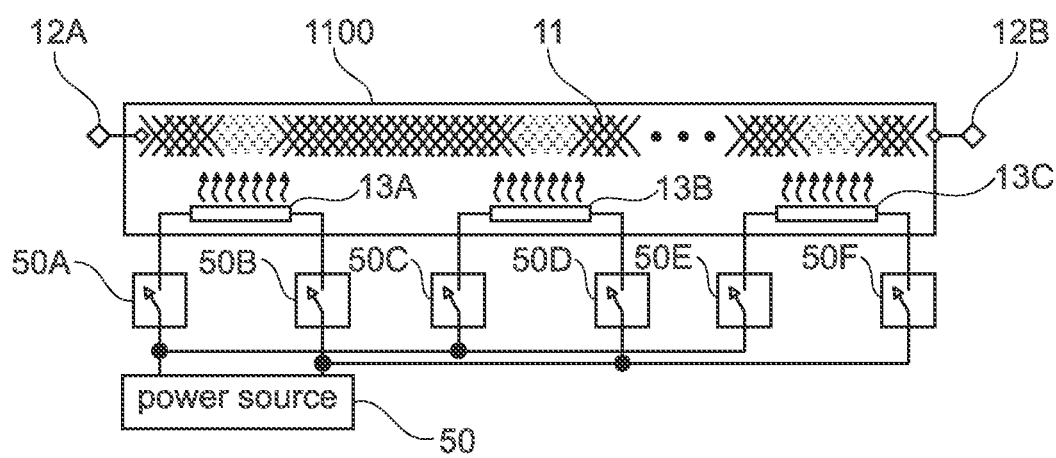

FIG. 11 comprises an embodiment where a heater device includes three heaters 13A, 13B, 13B provided to heat different portions of phase change material 11 in a phase change switch 1100. The number of three heaters 13A to 13C is merely an example, as indicated by dots, and other numbers of heaters, for example two heaters or more than three heaters, may also be provided.

In the embodiment of FIG. 11, between portions heated by heaters 13A, 13B, 13C, phase change material 11 always remains crystalline, thus providing an electrical connection between the portions heated by heater. In other embodiments, phase change material 11 may be discontinuous, and for example the discontinuous portions of phase change material 11 may be connected by metal connections or by other electrically conducting materials. In both cases, effectively the arrangement corresponds to a series connection of a plurality of phase change switches, which may increase a voltage tolerance of the PCM switch device.

In some embodiments, separate power sources may be provided to the individual heaters, each connected to the respective heater as discussed above, i.e. via a coupling device which may be implemented using diodes, switches, stacked MOSFETs or the like. In other embodiments, for example in FIG. 11, a single power source 50 is provided. Power source 50 is then connected to heaters 13A to 13C via a coupling device, which in case of FIG. 11 includes individual switch devices 50A to 50F.

For each heater individually, in this case during heating phases, a first impedance as discussed above may be provided, and outside heating phases a second, higher, impedance is provided, as explained above.

Figure 12:
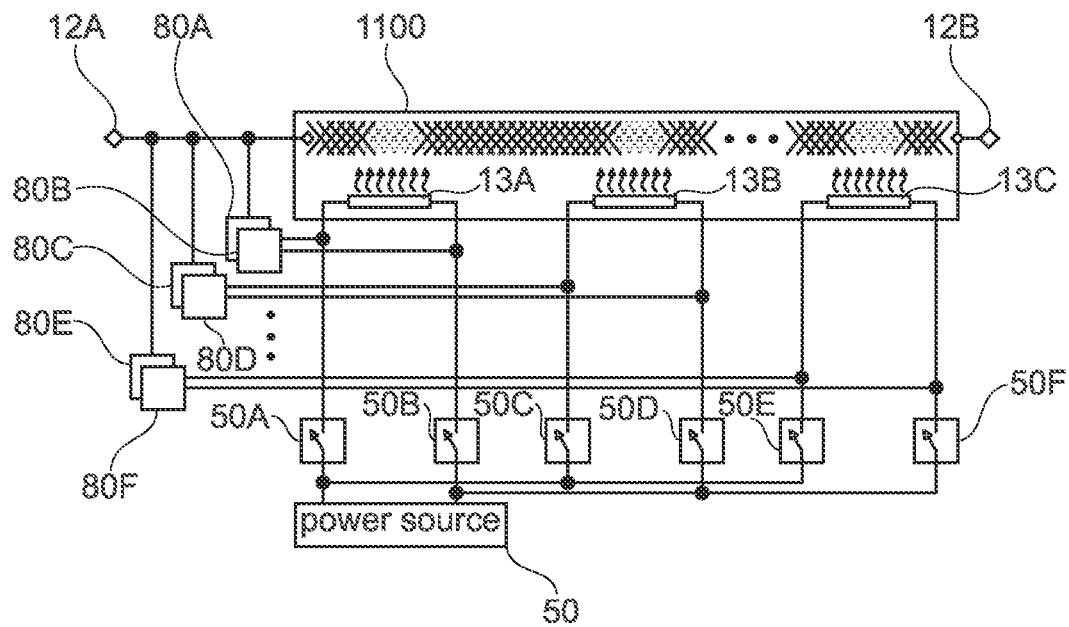

Also in the case of a plurality of heaters, impedance networks may be provided. FIG. 12 illustrates a corresponding embodiment, where impedance networks 80A to 80F couple terminal 12A to the terminals of heaters 13A to 13V as shown. Impedance networks 80A to 80F may be implemented as explained previously with respect to FIGS. 8A and 8B.

As can be seen, in the embodiment of FIG. 8A one impedance network is coupled to first terminal 12A, while another impedance network is coupled to terminal 12B, while in FIG. 12 all impedance networks are coupled to terminal 12A. For all embodiments including impedance networks discussed herein, both alternatives are possible. In yet other embodiments, one or more impedance networks may only be coupled between first terminal 12A and one of the heater terminals, not both.

The alternative used may depend on the implementation of the heater and use of the PCM switch device.

For example, FIG. 8A shows an implementation of bootstrapping the heater, which also works bidirectionally. In implementations where one side, for example first terminal 12A can be identified as 'hot' (e.g. have an RF signal applied to it) while the other side, e.g. terminal 12B, is grounded, network 80B in FIG. 8A can be omitted to minimize the penalty on switch off-capacitance Coff and the voltage on the heater is given by the voltage division between impedance network 80A and diodes 60A/B.

FIG. 12 is such an embodiment where second terminal 12B is typically connected to ground, so no impedance networks need to be connected to second terminal 12B.

In yet other embodiments, if the heater resistance is low ohmic (as in the case of tungsten-based heater) only one of the two heater terminals (e.g. one of heater terminals 16A, 16B) needs to be connected to first terminal 12A.

Figure 13:
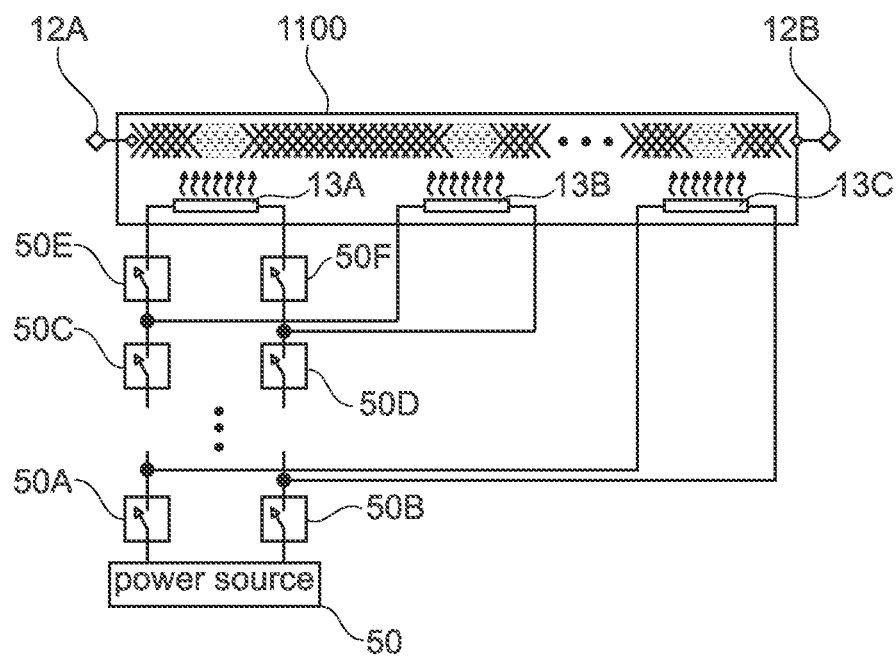

In the embodiments of FIGS. 11 and 12, switch devices 50A to 50F are coupled in parallel. In other embodiments, series connections may be used. FIG. 13 shows such an embodiment, where switch devices 50A, 50C and 50E are coupled in series, and switch devices 50B, 50D and 50F are coupled in series. Heaters 13A to 13C are coupled to the series connection as shown in FIG. 13, to nodes between switch devices or, in case of heater 13A, to switch devices 50E and Instead of switch devices, other coupling devices like the diodes previously discussed may be used.

Figure 14:
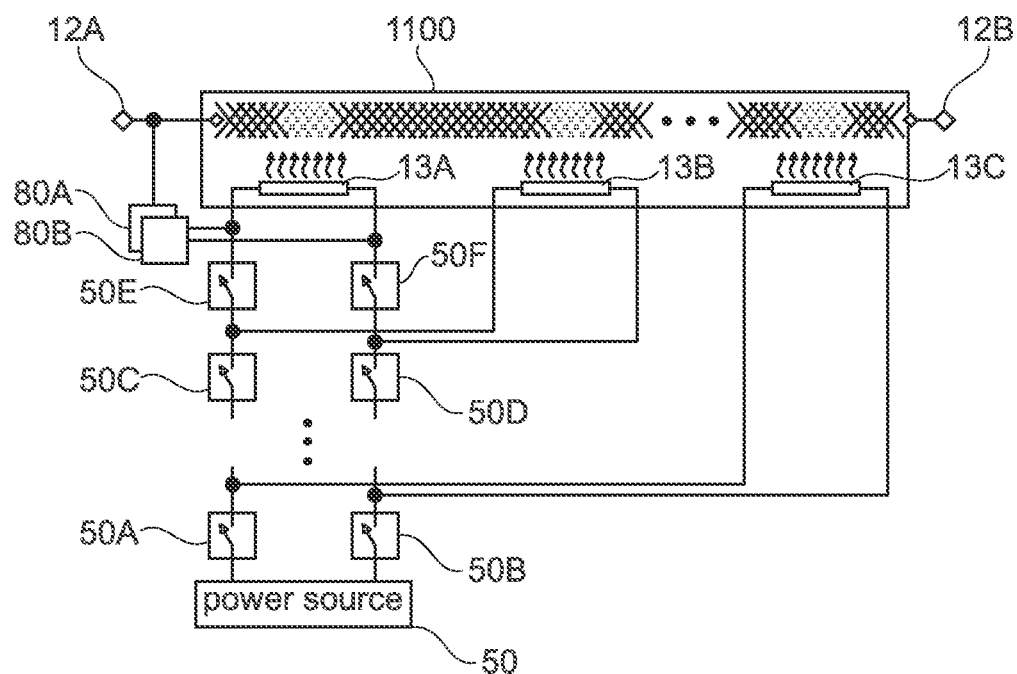

Also with such a series connection of switches, impedance networks may be used. FIG. 14 illustrates a corresponding embodiment, where impedance networks 80A, 80B are coupled between terminal 12A and nodes between switch devices 50E, 50F, respectively, and heater 13A as shown. Impedance networks 80A, 80B may be dimensioned and implemented as explained with reference to FIGS. 8A to 8B, matching the off-capacitance of switch devices 50A to 50F when they are at an off-state.

Figure 15:
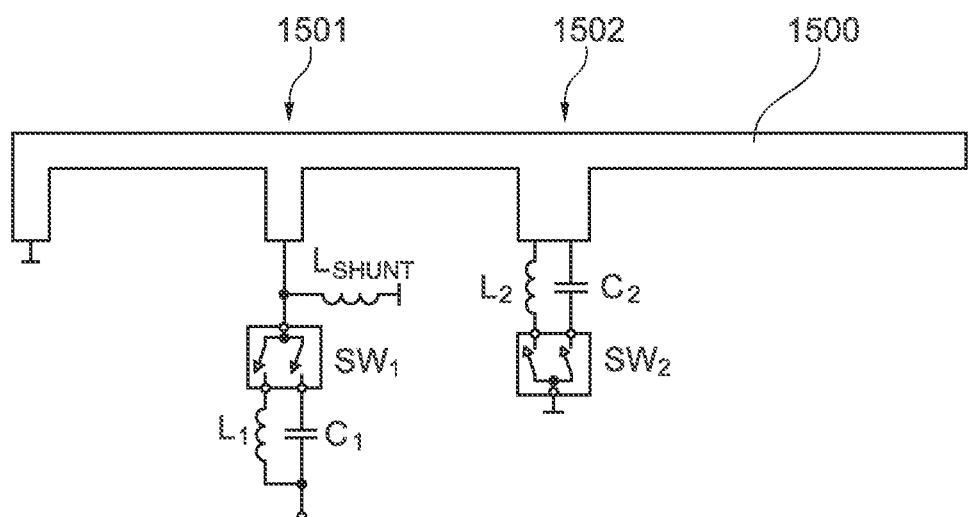
FIG. 15 illustrates an example antenna-tuning application using phase change material switch devices.

PCM switch devices as mentioned above may be used in a variety of applications, including antenna-tuning applications. FIG. 15 illustrates an example antenna-tuning application using switch devices as discussed above.

FIG. 15 illustrates an antenna structure 1500 including a so-called feed point 1501 and a first aperture point 1502.

Feed point 1501 is coupled to a shunt inductor $L_{shunt}$ and, for tuning purposes, may be selectively coupled via a first switch device $SW_1$ with a parallel circuit of an inductor $L_1$ and a capacitor $C_1$. Aperture point 1602 is coupled to an inductor $L_2$ and a capacitor $C_2$ is shown, which may be selectively coupled to ground via a switch device $SW_2$. Switch devices $SW_1$, $SW_2$ in an embodiment are implemented using PCM switch devices according to any of the above embodiments. In this way, the tuning behaviour and radio frequency behaviour may be improved.

Some embodiments may be defined by the following examples:

Example 1. A phase change material switch device, comprising: a phase change material, a heater device thermally coupled to the phase change material, a power source, and a coupling device electrically coupled between the power source and the heater device, wherein the coupling device is configured to: provide a first electrical impedance between the power source and the heater device in a first state where current supplied to the heater device from the power source for heating the phase change material, and provide a second electrical impedance between the power source and the heater device higher than the first electrical impedance in a second state outside heating phases of the heater device.

Example 2. The phase change material switch device of example 1, wherein the second electrical impedance is at least 100 times higher than the first electrical impedance.

Example 3. The phase change material switch device of example 1 or 2, wherein a magnitude of the second electrical impedance is 1 Kiloohm or more.

Example 4. The phase change material switch device of any one of examples 1 to 3, wherein a magnitude of the first electrical impedance is 50 Ohm or less.

Example 5. The phase change material switch device of any one of examples 1 to 4, wherein the heater device comprises N heaters, wherein N is a positive integer greater than or equal to 1.

Example 6. The phase change material switch device of example 5, wherein, for each heater of the N heaters, the coupling device comprises a first coupling element coupled between a first terminal of the power source and a first terminal of the respective heater, and a second coupling element coupled between a second terminal of the power source and a second terminal of the respective heater.

Example 7. The phase change material switch device of example 6, wherein the first coupling elements of the N heaters are coupled in parallel to the first terminal of the power source, and the second coupling elements of the N heaters are coupled in parallel to the second terminal of the power source.

Example 8. The phase change material switch device of example 6, wherein the first coupling elements of the N heaters are coupled in series to the first terminal of the power source, and the second coupling elements of the N heaters are coupled in series to the second terminal of the power source.

Example 9. The phase change material switch device of any one of examples 1 to 8, wherein the coupling device comprises at least one diode configured to be forward biased in the first state and reverse biased in the second state.

Example 10. The phase change material switch device of example 9, further comprising a biasing terminal for reverse biasing a diode of the at least one diode in the second state.

Example 11. The phase change material switch device of example 9 or 10, wherein the at least one diode is electrically isolated from a substrate carrying the phase change material switch device.

Example 12. The phase change material switch device of any one of examples 9 to 11, wherein the at least one diode comprises a p-i-n diode.

Example 13. The phase change material switch device of any one of examples 9 to 12 and any one of examples 6 to 8, wherein each first coupling element comprises a first diode of the at least one diode, and wherein each second coupling element comprises a second diode of the at least one diode.

Example 14. The phase change material switch device of any one of examples 1 to 13, wherein the coupling device comprises at least one switch device configured to be closed in the first state and open in the second state.

Example 15. The phase change material switch device of example 13, wherein the switch device comprises a plurality of stacked transistors.

Example 16. The phase change material switch device of any one of examples 1 to 15, further comprising: a first device terminal coupled to the phase change material, a second device terminal coupled to the phase change material, and an impedance device coupled between the first device terminal and the heater device.

Example 17. The phase change material switch device of example 16 and of example 5, wherein, for at least one of the N heaters the impedance device comprises a first impedance element coupled between the first device terminal and a first terminal of the respective heater, and a second impedance element coupled between the first device terminal and a second terminal of the respective heater.

Example 18. The phase change material switch device of example 16 or 17, wherein the impedance device is configured to linearly distribute a voltage at the first device terminal across the heater device.

Example 19. The phase change material switch device of any one of examples 16 to 18, wherein the impedance device is selected from the group consisting of a capacitive device, a resistive device or a combination thereof.

Example 20. A method of operating a phase change material switch device including a phase change material and a heater device thermally coupled to the phase change material, the method comprising: providing a first electrical impedance between a power source and the heater device in a first state where current is supplied to the heater device from the power source for heating the phase change material, and providing a second electrical impedance between the power source and the heater device higher than the first electrical impedance in a second state outside heating phases of the heater device.

Example 21. The method of example 20, wherein the phase change material switch device is the phase change material switch device of any one of examples 1 to 19.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A phase change material switch device, comprising:
a phase change material;
a heater device thermally coupled to the phase change material;
a power source; and
a coupling device electrically coupled between the power source and the heater device,
wherein the coupling device is configured to:
provide a first electrical impedance between the power source and the heater device in a first state in which current is supplied to the heater device from the power source for heating the phase change material; and
provide a second electrical impedance between the power source and the heater device higher than the first electrical impedance in a second state which is outside heating phases of the heater device.

2. The phase change material switch device of claim 1, wherein the second electrical impedance is at least 100 times higher than the first electrical impedance.

3. The phase change material switch device of claim 1, wherein a magnitude of the second electrical impedance is 1 Kiloohm or more, and/or wherein a magnitude of the first electrical impedance is 50 Ohm or less.

4. The phase change material switch device of claim 1, wherein the heater device comprises N heaters, and wherein N is a positive integer greater than or equal to 1.

5. The phase change material switch device of claim 4, wherein for each heater of the N heaters, the coupling device comprises a first coupling element coupled between a first terminal of the power source and a first terminal of the respective heater, and a second coupling element coupled between a second terminal of the power source and a second terminal of the respective heater.

6. The phase change material switch device of claim 5, wherein the first coupling elements of the N heaters are coupled in parallel to the first terminal of the power source, and the second coupling elements of the N heaters are coupled in parallel to the second terminal of the power source.

7. The phase change material switch device of claim 5, wherein the first coupling elements of the N heaters are coupled in series to the first terminal of the power source, and the second coupling elements of the N heaters are coupled in series to the second terminal of the power source.

8. The phase change material switch device of claim 1, wherein the coupling device comprises at least one diode configured to be forward biased in the first state and reverse biased in the second state.

9. The phase change material switch device of claim 8, further comprising a biasing terminal for reverse biasing a diode of the at least one diode in the second state.

10. The phase change material switch device of claim 8, wherein the at least one diode comprises a p-i-n diode.

11. The phase change material switch device of claim 1, wherein the coupling device comprises at least one switch device configured to be closed in the first state and open in the second state.

12. The phase change material switch device of claim 1, further comprising:
    a first device terminal coupled to the phase change material;
    a second device terminal coupled to the phase change material; and
    an impedance device coupled between the first device terminal and the heater device.

13. The phase change material switch device of claim 12, wherein the heater device comprises N heaters, and wherein N is a positive integer greater than or equal to 1.

14. The phase change material switch device of claim 13, wherein for at least one of the N heaters the impedance device comprises a first impedance element coupled between the first device terminal and a first terminal of the respective heater, and a second impedance element coupled between the first device terminal and a second terminal of the respective heater.

15. The phase change material switch device of claim 13, wherein the impedance device is configured to linearly distribute a voltage at the first device terminal across the heater device.

16. A method of operating a phase change material switch device including a phase change material and a heater device thermally coupled to the phase change material, the method comprising:
    providing a first electrical impedance between a power source and the heater device in a first state where current is supplied to the heater device from the power source for heating the phase change material; and
    providing a second electrical impedance between the power source and the heater device higher than the first electrical impedance in a second state outside heating phases of the heater device.

\* \* \* \* \*